US007147477B2

(12) United States Patent
Soh

(10) Patent No.: US 7,147,477 B2
(45) Date of Patent: Dec. 12, 2006

(54) HIGH DENSITY ELECTRICAL CONNECTOR

(75) Inventor: Lip Teck Soh, Singapore (SG)

(73) Assignee: FCI, Versailles (FR)

( * ) Notice: Subject to any disclaimer, the term of this patent is extended or adjusted under 35 U.S.C. 154(b) by 0 days.

(21) Appl. No.: 10/549,207

(22) PCT Filed: Mar. 25, 2004

(86) PCT No.: PCT/SG2004/000070

§ 371 (c)(1),
(2), (4) Date: Sep. 15, 2005

(87) PCT Pub. No.: WO2004/086564

PCT Pub. Date: Oct. 7, 2004

(65) Prior Publication Data

US 2006/0172563 A1 Aug. 3, 2006

(30) Foreign Application Priority Data

Mar. 25, 2003 (SG) ................................ 200301490

(51) Int. Cl.
*H01R 12/00* (2006.01)
*H05K 1/00* (2006.01)

(52) U.S. Cl. ........................................... 439/66; 439/74

(58) Field of Classification Search .................. 439/66, 439/74, 862, 630
See application file for complete search history.

(56) References Cited

U.S. PATENT DOCUMENTS

| | | | | |
|---|---|---|---|---|
| 3,993,384 | A | 11/1976 | Dennis et al. | 339/17 CF |
| 5,967,800 | A | 10/1999 | Bishop | 439/74 |
| 5,980,323 | A | 11/1999 | Bricaud et al. | 439/630 |
| 6,625,881 | B1 | 9/2003 | Ammar et al. | 29/830 |
| 6,663,445 | B1 | 12/2003 | Yeh | 439/862 |

*Primary Examiner*—Tulsidas C. Patel
*Assistant Examiner*—Vladimir Imas
(74) *Attorney, Agent, or Firm*—Harrington & Smith. LLP

(57) ABSTRACT

A compression connector for interconnecting a two electrical devices including, a housing mounting at least one conductive element defining; a first beam section fastened to the housing in a cantilevered manner allowing resilient deflection and having a first contact region at the fastened end for connection to the first device, and a second beam section extending at a first end thereof in a cantilevered manner from the movable end of the first beam section, the second beam section including a second contact region away from the first end and disposed to engage with compressively, and deflectable by the first device. The conductive element is formed by out of plane bending to position the second beam back over the first beam, so that the wiping action by the first contract region of the second beam in a direction transverse to the compression engagement direction is controlled by geometry selection of the beams.

43 Claims, 3 Drawing Sheets

HIGH DENSITY ELECTRICAL CONNECTOR

FIELD OF THE INVENTION

The present invention relates to a high density electrical connector and in particular although not solely to an electrical connector, having conductive elements extending generally perpendicular to the compressive direction for compressive connection of a printed circuit board or the like with a removably engagable printed circuit board, wherein the movement of its individual conductive elements during engagement is (in a direction other than in the compressive direction) very limited such that an electrical connector of limited "wiping" distance, (i.e. distance of movement ("wiping") along the conductive portion of the removable PCB is minimised) can be provided.

BACKGROUND TO THE INVENTION

High density electrical connectors normally consist of a housing which contains a plurality of conductive elements which each provide an interconnection between the circuits of two electrical devices. Often these take the form of a linear side by side array having a longitudinal direction or width parallel to the array, a height parallel to the compressive dimension, and a length perpendicular to both.

Normally the two electrical devices are for example printed circuit boards (PCB) wherein the electrical connector is mounted on one printed circuit board. The conductive elements are each engaged to electrical traces of that circuit board. The other circuit board is to become compressively engaged to the other ends of the conductive elements. With the provision of a high density electrical connector with moveable compressive contact points, a repeatable connection between the two PCBs can be achieved.

However in some applications, the width of a connector (lateral to the direction of compressive displacement of the conductive elements during engagement) needs to be narrow in light of space constraints. For example in the application where a PCB inside a hard drive is to engage with other circuitry of a PC, the opening through the casing of the hard drive is very narrow. In order for conductive elements of an electrical connector to reach into the interior of the casing of the hard drive, the length of connector needs to be narrow to fit through the opening of the casing. Furthermore, the conductive elements of such an electrical connector, should remain substantially within the perimeter of the housing of the connector to prevent them from contacting the casing and possibly shorting out a circuit. For example with reference to FIG. 1, there is shown a sectional views through a prior electrical connector and illustrates the light hand side conductive element deflected and in compressive engagement with a PCB. The left hand side shows the conductive element in an undeflected state. It can be seen that the distance of displacement along the length (in a horizontal direction and perpendicular to the compressive direction) of the upper contact point of the conductive element is relatively large, this is referred to as the "wiping distance". In the example shown in FIG. 1, it can be seen that the conductive element at the upper contact point protrudes outside of the perimeter of the housing of the connector. To avoid this, the housing would need to be of a greater length so as to accommodate the wiping distance of the upper contact region of the conductive element.

Inherently the connector design of FIG. 1 occupies an effective space which is of a length which for certain applications is too wide.

Accordingly it is an object of the present invention to provide a high density electrical connector which provides conductive elements of a narrow size (perpendicular to the compressive direction) and having a significantly reduced wiping distance over that of the prior art, or which will at least provide the public with a useful choice.

BRIEF DESCRIPTION OF THE INVENTION

Accordingly a first aspect of the present invention consists in an electrical connector for selective electrical connection of a second electrical device to a first electrical device comprising, at least one conductive element, said conductive element comprising a) a first contact region (for at least electrical contact with said first electrical device)

b) a first beam region deflectable about a first pivot axis, c) a second beam region connected to said first beam region, said second beam region deflectable, in relation to said first beam region about a second pivot axis and d) a second contact region connected to said second beam region, said conductive element having a first phase of deflection characterised in that the majority of bending deflection is about said first pivot axis, and a second phase of bending characterized in that the majority of bending deflection occurs about said second pivot axis, at least one insulative component (hereafter "housing")

wherein said conductive element is at least partially located by and within said housing, said conductive element having a first undeflected condition and a second deflected condition, wherein intermediate thereof upon progressive compression application to said second contact region by said second electrical device, said first phase of deflection occurs until a point between said first and second beam regions engages upon a part of said housing, where after only said second phase of deflection occurs, to maintain an electrical connection between said first and second electrical devices that has a minimal deflection of said second contact region perpendicular to both said compression direction and at least one of said pivot axes.

Preferably each said electrical device has a major surface.

Preferably said part of said housing is perpendicular to one of said major surfaces.

Preferably said major surfaces are parallel.

Preferably said second phase bending occurs only about said second pivot axis.

Preferably said pivot axes are parallel.

Preferably said pivot axes are perpendicular to said compression direction and parallel to said major surfaces.

Preferably said conductive element has an aspect ratio of height to length of 1 to 3 or greater.

Preferably said height is parallel to said compression direction.

Preferably said compression dimension is vertical.

Preferably said length is perpendicular to both said compression direction and pivot axes.

Preferably said conductive element is formed by out of plane bending from a sheet material.

Preferably said conductive element is a metal strip formed from said sheet material.

Preferably said metal is a copper alloy.

Preferably said deflection of said conductive element is elastic.

Preferably said housing is a plastics material moulding.

Preferably there is a plurality of electrical connectors.

Preferably said plurality of connectors are arranged in a side by side linear array.

Preferably said conductive elements are located within said housing in a sliding engagement with barb retention.

Preferably said first contact region also mechanically connects said electrical connector to said second electrical device.

In a second aspect the present invention consists in a conductive element for inclusion in an electrical connector, said conductive element comprising a) a first contact region (for at least electrical contact with a first electrical device)

b) a first beam region deflectable about a first pivot axis, c) a second beam region connected to said first beam region, said second beam region deflectable, in relation to said first beam region about a second pivot axis and d) a second contact region connected to said second beam regions said conductive element having a first phase of deflection characterised in that the majority of bending deflection is about said first pivot axis, and a second phase of bending characterized in that the majority of bending deflection occurs about said second pivot axis, said first phase of deflection occurs until a point between said first and second beam regions stops upon a part of said housing, where after only said second phase of deflection occurs, to maintain an electrical connection between said first and a second electrical device that has a minimal deflection of said second contact region perpendicular to both said compressive direction and at least one of said pivot axes.

Preferably said second phase bending occurs only about said second pivot axis.

Preferably both said pivot axes are parallel.

Preferably said conductive element is formed from a sheet material.

Preferably said conductive element is a metal strip formed from said sheet material.

Preferably said metal is a copper alloy

Preferably said conductive element has an aspect ratio of height to length of 1 to 3 or greater.

Preferably said height is parallel to said compression direction.

Preferably said compression dimension is vertical.

Preferably said length is perpendicular to both said compression direction and pivot axes.

In a further aspect the present invention consists in a compression connector for interconnecting at least one electrical trace of a circuit of a first electrical device and a circuit of a second electrical device said compression connector comprising a housing mounting at least one conductive element of a sheet metal material formed by out of plane bending to define at least, (a) a first beam section fastened to said housing in a cantilevered manner to allow resilient deflection of a movable end of said first beam section relative to said housing and having, a first contact region at another (preferably at a non-movable) end of said first beam region for at least electrical connection to said electrical device, (b) a second beam section extending at a first end thereof in a cantilevered manner from said movable end of said first beam section said second beam section including a second contact region provided along said beam away from said first end and disposed to engage with, in a compressive manner, and deflectable by an electrical trace of said first electrical device, said conductive element formed by out of plane bending to position said second beam section at least in part, back over said first beam section said second contact region is positioned to be deflectable in a compound cantilevered manner by said first and second beam sections, relative to said housing, in a vertical direction, wherein the wiping action across said electrical trace by said first contact region of said second beam in a direction transverse to the compression engagement direction is controlled to within predetermined limits by the appropriate selection the geometry of said beams.

Preferably said deflections are in the same plane.

Preferably said conductive element has an aspect ratio of width to height of 1 to 3 or greater.

Preferably said height is parallel to said compression direction.

Preferably said compression direction is vertical.

Preferably said length is perpendicular to said compression direction and parallel to said deflection plane.

Preferably said conductive element is a metal strip formed from said sheet material.

Preferably said metal is a copper alloy.

Preferably said deflection of said conductive element is elastic.

Preferably said housing is a plastics material moulding.

Preferably there is a plurality of compression connectors.

Preferably said plurality of compression connectors is arranged in a side by side linear array.

Preferably said conductive elements are located within said housing in a sliding engagement with barb retention.

Preferably said first contact region also mechanically connects said electrical connector to said second electrical device.

In yet a further aspect the present invention consists in an electrical connector as claimed in any one of the preceding claims substantially as hereinbefore described with reference to FIGS. 2 through 5.

In yet still a further aspect the present invention consists in a conductive element as claimed in any one of the preceding claims substantially as hereinbefore described with reference to FIGS. 2 through 5.

DETAILED DESCRIPTION OF THE INVENTION

A preferred embodiment of the present invention will now be disclosed with reference to FIGS. 1 to 5.

Figure 1:
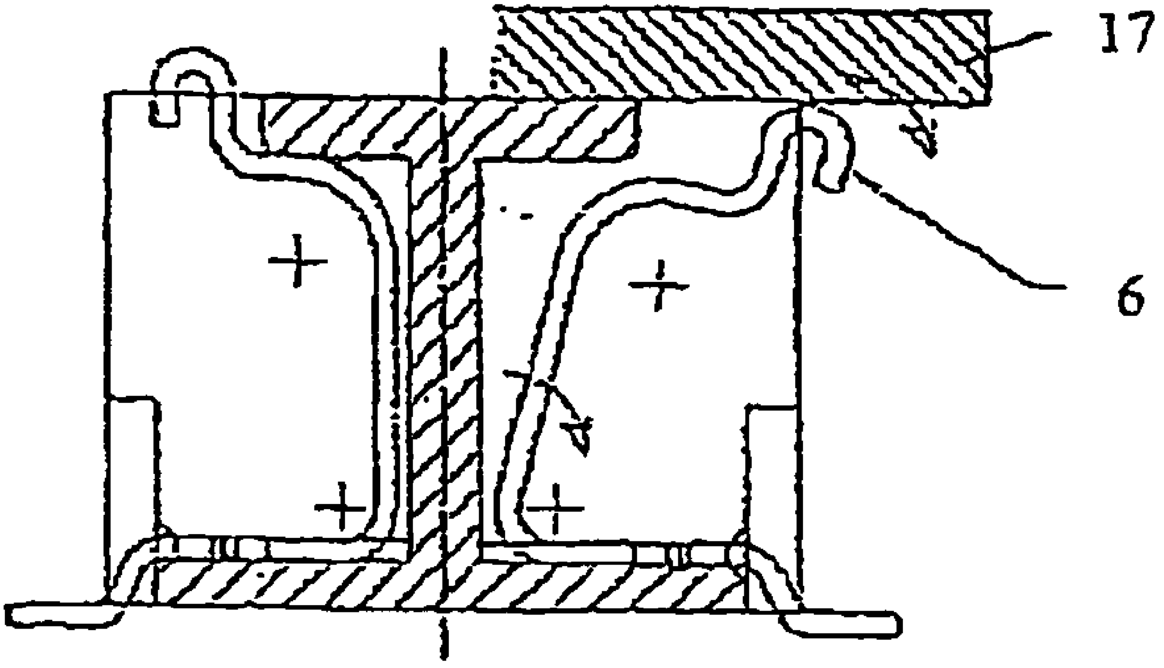
FIG. 1 (PRIOR ART)
FIG. 1 is sectional view through a prior art electrical connector.
Figure 2:
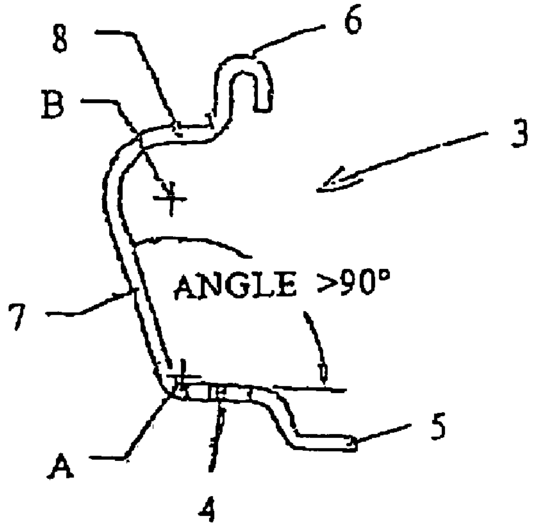
FIG. 2 is a side view of a conductive element of the electrical connector of the present invention.
Figure 3:
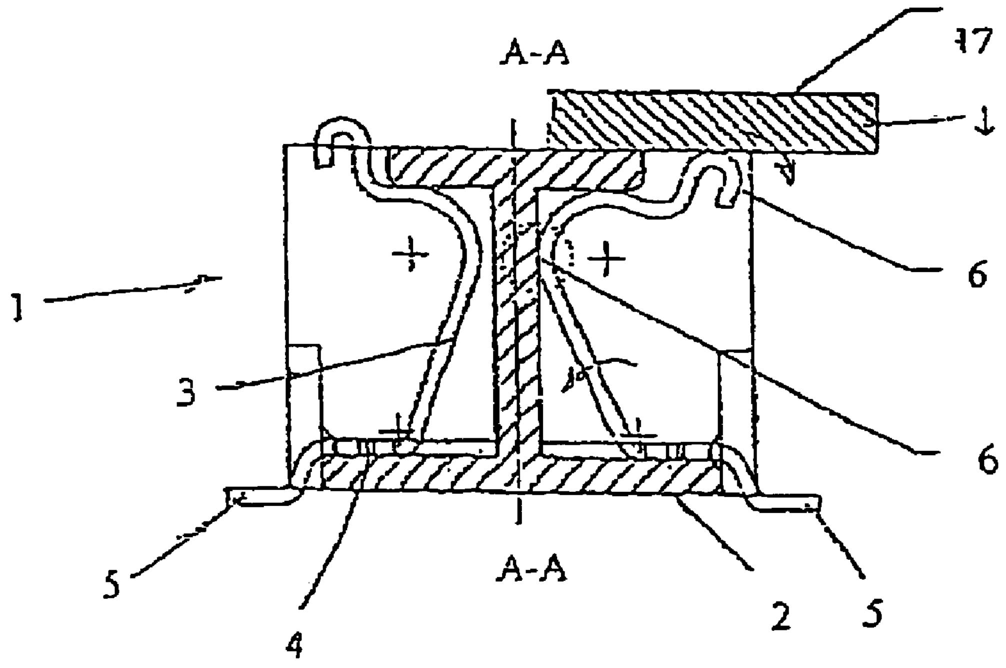
FIG. 3 is a cross sectional view of a connector which incorporates the conductive element of FIG. 2 and wherein a PCB is engaged and having deflected the conductive element.
Figure 4:
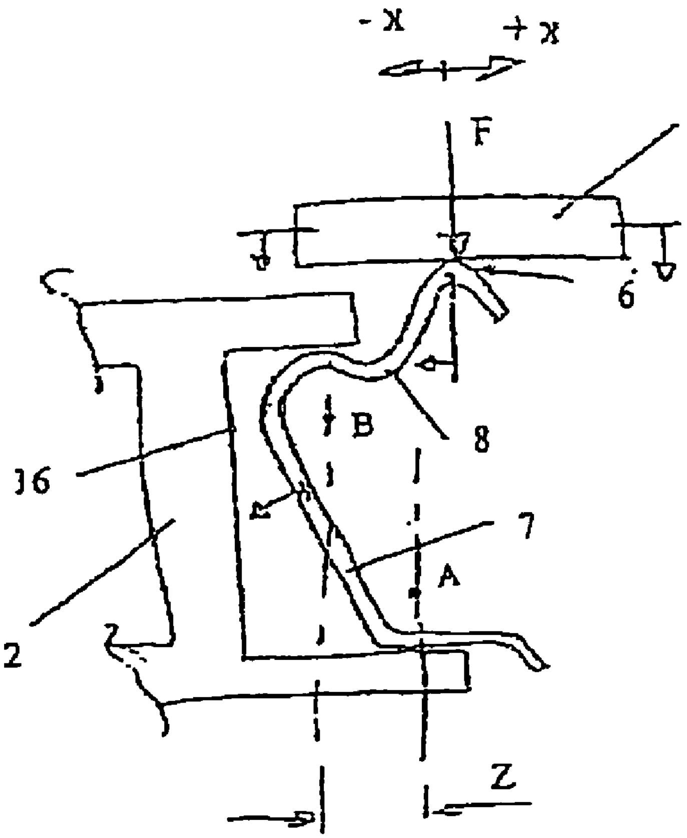
FIG. 4 is a sectional view of part of a connector illustrating the conductive element in an undeflected state.

With reference to FIG. 3, there is shown an electrical connector 1 in cross sectional view. The sectional view is taken at a plane which is perpendicular to the general elongate direction of the electrical connector. An electrical connector of this kind will include at least one and as shown in FIG. 3, two arrays of a plurality of conductive elements which extend along the length of the connector. Such conductive elements are positioned in a side by side relationship or linear array and each array is positioned substantially as a mirror image to the other about the centre line A—A.

The electrical connector 1 consists of a housing 2 which is normally made of a plastic material, and hence is non-conductive. The housing 2 contains regions for locating individual conductive elements 3. The conductive elements are of an elongate shape and of a narrow width (not illustrated). The housing 2 contains cavities into which each conductive element can locate. In the most preferred form, the housing provides a cavity for each conductive element.

Each conductive element 3 is made of a conductive metallic material (such as for example a copper alloy). The material that is chosen is of a flexible but resilient kind so that a deflection of the conductive element will result in a biasing force being generated by the conductive element in a direction opposite to the direction of compression. Whilst ideally the material of the conductive elements remains in the elastic region of the stress—strain curve this need not necessarily be so.

The conductive elements 3 are preferably engaged to the housing in a permanent manner at a base region 4 of each conductive element. At the base region 4, the conductive elements are securely and relatively fixed to the housing 2. Fastening can be achieved by a barbed sliding engagement. A barbed feature on the conductive element deforms the plastic walls of the cavity of the housing 2 and thereby becomes affixed to the housing 2. Alternative forms of engagement of each conductive element with the housing will be apparent to a person skilled in the art.

The conductive element (being made from a sheet material) is preferably bent to provide its form. The conductive element is preferably firstly stamped from a sheet of raw material whereafter it is formed by an out of plane bending. Stamping generates a substantially straight and slender form of conductive element precursor whereafter the bending in a direction out of the plane provides the curved form as for example shown in FIG. 2.

Forming part of the conductive element and located from one side of the base region 4, is a first contact region 5. In the example as shown in FIG. 3, the first contact region 5 is a foot shaped region which can be engaged to a circuit trace of a first electrical device (not shown). The fixing of the first contact regions 5 to the first electrical device may be in a permanent manner such as by soldering. Alternatively the first contact regions 5 may be engaged to the electrical traces of a first electrical device in a non permanent manner such as by a compression connection engagement. However in the example shown in FIG. 3, the first contact regions 5 of each element are designed for a more permanent engagement to the first electrical device. Extending from the base region 4, in the opposite direction to the first contact points 5, is a deflectable section of the conductive element. The deflective section extends from the base region 4 to the second contact region 6. The second contact region 6 is provided to extend from the upper perimeter of the housing (as shown in the left hand side of FIG. 3) when in a non deflected state. The second contact region 6 upon deflection by the engagement of a second electrical device 17 will move in a downwardly direction. The resultant compressive force that is generated by the conductive element at the second contact region 6 is in an upward direction, being in a direction opposite to the direction from which compressive engagement of the second electrical device 17 occurs. The deflectable section of each conductive element consists of a first beam region 7 and second beam region 8. The first beam region 7 is effectively cantilevered from the base region 4. Due to the inherently resilient but deflectable nature of the material chosen, deflection of the first beam region 7 may be defined to be about a pivot point A which is at or proximate to the base region 4. The first beam region 7 extends from the base region 4 in a generally upward but slightly inclined angle to the vertical towards its second distal end wherefrom the second beam region 8 extends.

The second beam region 8 extends and is engaged to the first beam region 7 in a cantilevered manner. The base of such cantilever is however displaceable as a result of the movement of the first beam region 7 about its pivot point A. In addition to the movement of the base or pivot point of the second beam region 8 about pivot point A, the beam region itself is displaceable about its pivot point such as for example pivot point B. Beam region 8 as a result of its resilient flexible cantilevered engagement to the first beam region 7, can pivot about pivot point B. Such pivoting is induced as a result of the application of pressure to the second contact region 6.

Figure 5:
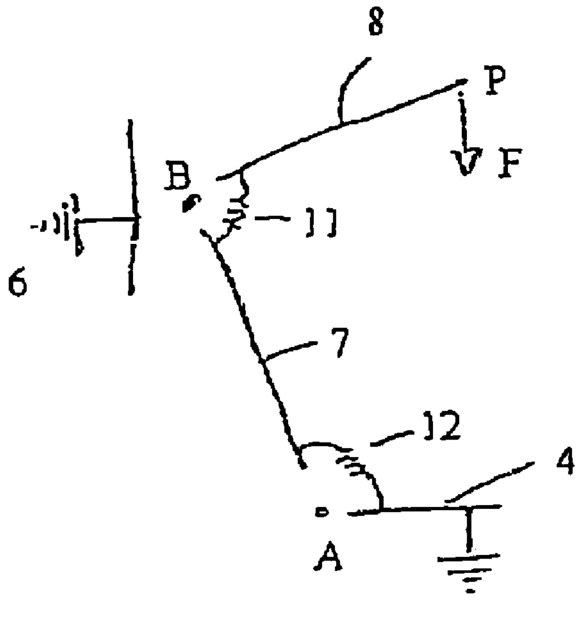
FIG. 5 is a force diagram illustrating the various forces and related dimensions of one example of the conductive element of the present invention.

During the engagement of the second electrical device 17 with a conductive element at its second conductive region 6, the force that is applied is substantially in a direction towards the base region 4. The geometry and rigidity of the conductive element is designed so that during a displacement of the second conductive region 6 in a downward direction, the first beam region 7 will firstly be induced to pivot about its pivot point A. This is a first phase of deflection of the conductive element. With reference to FIG. 5, the representative image of the structural nature of the beams of FIG. 4 it can be seen that the deflection about the resiliently flexible transition 12 between the base region 4 and the first beam region 7 may be less than that provided about the transition 11 between the first beam region 7 and second beam region 8 as a result of appropriate geometry. Whilst some movement of the second beam region 8 about its primary pivot point B will be induced during the first phase of movement, the most significant movement of the conductive element will be about pivot point A.

A movement limiting means 16 of the housing 2, is provided so that during the first phase of movement of deflection of the conductive element such movement is terminated once the first beam region 7 (or an extension thereof) becomes engaged with the stop 16. At such point the first beam region 7 no longer is able to be deflected about the pivot point A and its rotation will cease. Such termination of movement of beam region 7 will occur when the second contact region 6 is not quite in a condition of full engagement with the second electrical device 17. The second electrical device 17 will continue to proceed for engagement with the conductive elements in a direction towards the base region 4 of the conductive element. Once rotation of the beam region 7 about pivot point A has ceased the second beam region 8, will thereafter pivot about its respective pivot point B. During this second phase of engagement the second contact region 6 will continue to be displaced in a downward direction towards the base region 4.

In the first phase of establishing contact, the second contact region 6 effectively rotates about pivot point A (when looking at the right hand side of the connector) in an anti-clockwise direction about pivot point A. Whilst some pivoting of the second beam about pivot point B will occur, the net effect of the displacement of the second contact region 6 during this first phase of movement is that it will either move towards the left or remain substantially stationary relative to the housing and/or the second electrical device.

During the second phase of engagement, it will only be the second beam 8 of the conductive element which will be displaced and such displacement is about pivot point B. At such a point in time the second contact region 6 will move in a direction towards the right (when looking at the right contact elements with reference to the drawings) relative to the housing and/or the second electrical device 17 or at least remain stationary (in the horizontal direction).

In essence the movement of the second contact region 6 will be in a −X direction (with reference to FIG. 4) during the first phase of movement. Once the first beam region 7 mattes contact with the stop 16 of the housing, the second phase of movement will occur wherein the second contact region 6 of the conductive element moves in the +X direction. As a result of such a compound movement of the second connection point P, the displacement thereof in the +X and −X directions can be limited. With the selection of an appropriate geometry, the movement of the second contact region 6 about the pivot point B during the first phase of movement can be limited by ensuring that the transition between the first beam and second beam is effectively more rigid to the force applied by the second electrical device during its engagement than the transition between the base region 4 and the first beam region 7. The relative rigidity to movement of the first beam and second beam, is able to be provided as a result of the geometry of the conductive element. As, in effect the first beam and second beam are displaceable as cantilevered beams, both the shape angle to the force, as well as the lengths of the beams will dictate their rigidity to movement.

As well as providing for a compound movement to the displacement of the second contact region to ensure limited degree of displacement in the +X and −X directions, the conductive element is also of a narrow width (in the +X and −X directions).

The first beam region 7 extends from the base region 4 at an acute angle to the vertical. It extends from the base region at an angle greater than 0° but less than 45°. It extends from the base region 4 at an angle which is in the direction (relative to the vertical) of the rotation of the first beam region 7 during the first phase of movement. The distal end of the first beam region 7 is hence provided (in a vertical sense) towards one side of the base region 4. At the distal end of the first beam region 7, the transition to the second beam region 8 is provided. The second beam region 8 extends from the first beam region 7 in a more horizontal direction than the more vertical extension of the first beam region 7. The second beam region 8 extends from the first beam region 7 to the second contact region 6. In effect as a result of the conductive element design, the two beam sections have different rigidity to displacement. The rigidity is determined by factors such as the profile and geometry of the beams and the transitions between beams and between the base. When acting independently, each beam region will rotate in a different direction relative to the housing. As force is applied to the contact region 6, each beam region rotates in a direction and magnitude until equilibrium of force or the physical stop (16) is reached. The sequence at which the equilibrium of force or the physical stop is reached for each beam section is specifically designed and as a result a compound effect of movement is achieved and the final position of the contact region 6 is controlled and contained.

The provision of the physical stop (16) provides a greater degree of control of the final position and movement of the contact region 6. Whilst the physical stop need not be essential, it does provide a distinct two phase movement of the conductive element during compression.

The conductive element is of an upright nature (to the direction of compression connection). Its width (lateral to the compression direction) is less than its height and in the preferred form the height to width aspect ratio is greater than 1.5 and preferably greater than 2.

The invention claimed is:

1. An electrical connector for selective electrical connection of second electrical device to a first electrical device comprising;

at least one conductive element, said conductive element comprising a) a first contact region for at least electrical contact with said first electrical device, b) a first beam region deflectable about a first pivot axis, c) a second beam region connected to said first beam region, said second beam region deflectable, in relation to said first beam region about a second pivot axis and d) a second contact region connected to said second beam region, said conductive element having a first phase of deflection characterised in that the majority of bending deflection is about said first pivot axis, and a second phase of bending characterized in that the majority of bending deflection occurs about said second pivot axis, at least one insulative housing, wherein said conductive element is at least partially located by and within said housing, said conductive element having a first undeflected condition and a second deflected condition, wherein intermediate thereof upon progressive compression application to said second contact region by said second electrical device in a compression direction, said first phase of deflection occurs until a point between said first and second beam regions engages upon a part of said housing, where after only said second phase of deflection occurs, to maintain an electrical connection between said first and second electrical devices that has a minimal deflection of said second contact region perpendicular to both said compression direction and at least one of said pivot axes, wherein said first beam region extends at an acute angle with respect to said compression direction.

2. An electrical connector as claimed in claim 1 wherein each said electrical device has a major surface.

3. An electrical connector as claimed in claim 2 wherein said part of said housing is perpendicular to one of said major surfaces.

4. An electrical connector as claimed in claim 2 wherein said major surfaces are parallel.

5. An electrical connector as claimed in claim 1 wherein said second phase bending occurs only about said second pivot axis.

6. An electrical connector as claimed in claim 1 wherein said pivot axes are parallel.

7. An electrical connector as claimed in claim 1 wherein said pivot axes are perpendicular to said compression direction and parallel to said major surfaces.

8. An electrical connector as claimed in claim 1 wherein said conductive element has an aspect ratio of height to length between 1 and 3 or greater.

9. An electrical connector as claimed in claim 8 wherein said height is parallel to said compression direction.

10. An electrical connector as claimed in claim 1 wherein said compression direction is vertical.

11. An electrical connector as claimed in claim 8 wherein said length is perpendicular to both said compression direction and pivot axes.

12. An electrical connector as claimed in claim 1 wherein said conductive element is formed by out of plane bending from a sheet material.

13. An electrical connector as claimed in claim 12 wherein said conductive element is a metal strip formed from said sheet material.

14. An electrical connector as claimed in claim 13 wherein said metal is a copper alloy.

15. An electrical connector as claimed in claim 1 wherein said deflection of said conductive element is elastic.

16. An electrical connector as claimed in claim 1 wherein said housing is a plastics material moulding.

17. An electrical connector as claimed in claim 1 wherein there is a plurality of electrical connectors.

18. An electrical connector as claimed in claim 17 wherein said plurality of connectors is arranged in a side by side linear array.

19. An electrical connector as claimed in claim 1 wherein said conductive elements are located within said housing in a sliding engagement with barb retention.

20. A conductive element for inclusion in an electrical connector, said conductive element comprising a) a first contact region for at least electrical contact with a first electrical device b) a first beam region deflectable about a first pivot axis, c) a second beam region connected to said first beam region, said second beam region deflectable, in relation to said first beam region about a second pivot axis and d) a second contact region connected to said second beam region, wherein said first beam region and said second beam region deflect in response to a compressive force applied to said second contact region, and wherein said first beam region extends at an acute angle with respect to a direction of said compressive force, said conductive element having a first phase of deflection characterised in that the majority of bending deflection is about said first pivot axis, and a second phase of bending characterized in that the majority of bending deflection occurs about said second pivot axis, said first phase of deflection occurs until a point between said first and second beam regions stops upon a part of said housing where after only, said second phase of deflection occurs, to maintain an electrical connection between said first and a second electrical device that has a minimal deflection of said second contact region perpendicular to both said compressive direction and at least one of said pivot axes.

21. A conductive element as claimed in claim 20 wherein said second phase bending occurs only about said second pivot axis.

22. A conductive element as claimed in claim 20 wherein both said pivot axes are parallel.

23. A conductive element as claimed in claim 20 wherein said conductive element is formed from a sheet material.

24. A conductive element as claimed in claim 20 wherein said conductive element is a metal strip formed from said sheet material.

25. A conductive element as claimed in claim wherein said metal is a copper alloy.

26. A conductive element as claimed in claim 20 wherein said conductive element has an aspect ratio of height to length between 1 and 3 or greater.

27. A conductive element as claimed in claim 26 wherein said height is parallel to said compression direction.

28. A conductive element as claimed in claim 20 wherein said compression direction is vertical.

29. A conductive element as claimed in claim 26 wherein said length is perpendicular to both said compression direction and pivot axes.

30. A compression connector for interconnecting at least ore electrical trace of a circuit of a first electrical device and a circuit of a second electrical device said compression connector comprising, a housing mounting at least one conductive element of a sheet metal material formed by out of plane bending to define at least, (a) a first beam section fastened to said housing in a cantilevered manner to allow resilient deflection of a movable end of said first beam section relative to said housing and having a first contact region at another preferably at a non-movable end of said first beam region for at least electrical connection to said electrical device, (b) a second beam section extending at a first end thereof in a cantilevered manner from said movable end of said first beam section said second beam section including a second contact region provided along said beam away from said first end and disposed to engage with in a compressive manner, and deflectable by an electrical trace of said first electrical device, said conductive element formed by out of plane bending to position said second beam section at least in part, back over said first beam section said second contact region is positioned to be deflectable in a compound cantilevered manner by said first and second beam sections, relative to said housing, in a vertical direction, wherein the wiping action across said electrical trace by said first contact region of said second beam in a direction transverse to the compression engagement direction is controlled to within predetermined limits by the appropriate selection the geometry of said beams, wherein said first beam section extends at an acute angle with respect to said compression engagement direction.

31. A conductive element as claimed in claim 30 wherein said deflections are in the same plane.

32. A conductive element as claimed in claim 30 wherein said conductive element has an aspect ratio of height to width between 1 and 3 or greater.

33. A conductive element as claimed in claim 32 wherein said height is parallel to said compression direction.

34. A conductive element as claimed in claim 30 wherein said compression direction is vertical.

35. A conductive element as claimed in claim 34 wherein said length is perpendicular to said compression direction and parallel to said deflection plane.

36. A conductive element as claimed in claim 30 wherein said conductive element is a metal strip formed from said sheet material.

37. A conductive element as claimed in claim 36 wherein said metal is a copper alloy.

38. A conductive element as claimed in claims 30 wherein said deflection of said conductive element is elastic.

39. A conductive element as claimed in claim 30 wherein said housing is a plastics material moulding.

40. A conductive element as claimed in claims 30 wherein there is a plurality of compression connectors.

41. A conductive element as claimed in claim 40 wherein said plurality of compression connectors is arranged in a side by side linear array.

42. A conductive element as claimed in claim 30 wherein said conductive elements are located within said housing in a sliding engagement with barb retention.

43. A conductive element as claimed in claim 30 wherein said first contact region also mechanically connects said electrical connector to said second electrical device.

* * * * *

UNITED STATES PATENT AND TRADEMARK OFFICE

CERTIFICATE OF CORRECTION

PATENT NO. : 7,147,477 B2
APPLICATION NO. : 10/549207
DATED : December 12, 2006
INVENTOR(S) : Lip Teck Soh It is certified that error appears in the above-identified patent and that said Letters Patent is hereby corrected as shown below:

Column 9, line 66, after “claim” insert --24--.

Signed and Sealed this

First Day of May, 2007

JON W. DUDAS
*Director of the United States Patent and Trademark Office*